(12) United States Patent
Wang et al.

(10) Patent No.: US 10,839,899 B2
(45) Date of Patent: Nov. 17, 2020

(54) POWER ON RESET METHOD FOR RESISTIVE MEMORY STORAGE DEVICE

(71) Applicant: Winbond Electronics Corp., Taichung (TW)

(72) Inventors: Ping-Kun Wang, Taichung (TW);
Shao-Ching Liao, Taichung (TW);
Yu-Ting Chen, Taichung (TW);
Ming-Che Lin, Taichung (TW);
Chien-Min Wu, Taichung (TW);
Chia-Hua Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/181,372

(22) Filed: Nov. 6, 2018

(65) Prior Publication Data
US 2019/0221260 A1 Jul. 18, 2019

(30) Foreign Application Priority Data

Jan. 17, 2018 (CN) .......................... 2018 1 0043783

(51) Int. Cl.
*G11C 13/00* (2006.01)

(52) U.S. Cl.
CPC ........ *G11C 13/0038* (2013.01); *G11C 13/003* (2013.01); *G11C 13/004* (2013.01);
(Continued)

(58) Field of Classification Search
CPC ............ G11C 13/0038; G11C 13/0069; G11C 13/003; G11C 13/0064; G11C 13/004;
(Continued)

(56) References Cited

U.S. PATENT DOCUMENTS

| 2008/0062740 A1 | 3/2008 | Baek et al. |
| 2014/0233299 A1 | 8/2014 | Lan et al. |

(Continued)

FOREIGN PATENT DOCUMENTS

| CN | 105097021 | 11/2015 |
| TW | 201436317 | 9/2014 |

(Continued)

OTHER PUBLICATIONS

Grossi et al., "Relationship among Current Fluctuations during Forming, Cell-To-Cell Variability and Reliability in RRAM Arrays," 2015 IEEE International Memory Workshop (IMW), May 17-20, 2015, pp. 1-4.

(Continued)

*Primary Examiner* — Fernando Hidalgo
(74) *Attorney, Agent, or Firm* — JCIPRNET

(57) ABSTRACT

A power on reset method for a resistive memory storage device is provided and includes performing a forming procedure on a memory cell of the resistive memory storage device. The forming procedure includes applying at least one forming voltage and at least one reset voltage to the memory cell. The forming procedure further includes a thermal step. The step of applying at least one reset voltage to the memory cell may be preformed before or after the thermal step. After one forming voltage is applied, if the memory cell passes verification, the next forming voltage is not applied to the memory cell. After the thermal step, if the memory cell passes verification, the next forming voltage is not applied to the memory cell. In addition, after one reset voltage is applied, if the memory cell passes verification, the next reset voltage is not applied to the memory cell.

9 Claims, 4 Drawing Sheets

(52) U.S. Cl.
CPC ...... *G11C 13/0004* (2013.01); *G11C 13/0064* (2013.01); *G11C 13/0069* (2013.01); *G11C 2013/0045* (2013.01); *G11C 2013/0083* (2013.01); *G11C 2013/0092* (2013.01); *G11C 2213/82* (2013.01)

(58) Field of Classification Search
CPC ............ G11C 13/0004; G11C 2213/82; G11C 2013/0083; G11C 2013/0092; G11C 2013/0045
USPC .......................................................... 365/163
See application file for complete search history.

(56) References Cited

U.S. PATENT DOCUMENTS

2015/0287919 A1* 10/2015 Lin .......................... H01L 45/08
                                                              438/382
2016/0225442 A1* 8/2016 Asnaashari ........ G11C 13/0069
2017/0186948 A1 6/2017 Kim

FOREIGN PATENT DOCUMENTS

| TW | I488347 | 6/2015 |
| TW | 201543485 | 11/2015 |
| TW | I601322 | 10/2017 |

OTHER PUBLICATIONS

Ambrogio et al., "Data retention statistics and modelling in HfO2 resistive switching memories," 2015 IEEE International Reliability Physics Symposium, Apr. 19-23, 2015, pp. MY.7.1-MY.7.6.

* cited by examiner

POWER ON RESET METHOD FOR RESISTIVE MEMORY STORAGE DEVICE

CROSS-REFERENCE TO RELATED APPLICATION

This application claims the priority benefit of China application serial no. 201810043783.X, filed on Jan. 17, 2018. The entirety of the above-mentioned patent application is hereby incorporated by reference herein and made a part of this specification.

BACKGROUND

Technical Field

The disclosure relates to an operation method for a memory storage device and particularly relates to a power on reset (POR) method for a resistive memory storage device.

Description of Related Art

In recent years, resistive memory (such as resistive random access memory (RRAM)) has developed rapidly and is currently considered the most eye-catching memory structure of the future. Since the resistive memory has potential advantages such as low power consumption, high speed operation, high density, and compatibility with complementary metal oxide semiconductor (CMOS) process technology, it is suitable to serve as the non-volatile memory of the next generation.

The existing resistive memory cell usually includes a top electrode and a bottom electrode that are opposite to each other and a dielectric layer located between the top electrode and the bottom electrode. When a set operation is performed on the existing resistive memory cell, it is first necessary to perform a filament forming procedure. A positive bias is applied to the resistive memory cell to cause a current to flow from the top electrode to the bottom electrode such that an oxygen vacancy or an oxygen ion is generated in the dielectric layer to form a current path. At this time, a filament is formed. In the formed filament, the diameter of the portion near the top electrode is greater than the diameter of the portion near the bottom electrode. Besides, when a reset operation is performed on the existing resistive memory cell, a negative bias is applied to the resistive memory cell to cause a current to flow from the bottom electrode to the top electrode. At this time, the oxygen vacancy or the oxygen ion near the bottom electrode departs from the current path such that the filament is broken near the bottom electrode.

On the other hand, if the power on reset operation is performed on the resistive memory storage device by using existing techniques, it is possible to cause the filament in the memory cell to break, thereby resulting in low product reliability of the resistive memory storage device and high testing costs. Consequently, how to provide a power on reset method that improves product reliability of the resistive memory storage device and reduces testing costs is an important issue in this field.

SUMMARY

The disclosure provides a power on reset method for a resistive memory storage device, a method that may improve product reliability of the resistive memory storage device and reduce testing costs.

In this disclosure, the power on reset method for the resistive memory storage device includes performing a forming procedure on a memory cell of the resistive memory storage device. The forming procedure includes applying a plurality of forming voltages and at least one reset voltage to the memory cell.

Based on the foregoing, in the exemplary embodiments of the disclosure, the forming procedure of the power on reset method includes applying the at least one reset voltage to the memory cell, thereby improving product reliability of the resistive memory storage device and reducing testing costs.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Some embodiments will be proposed as examples of the disclosure hereinafter. However, it should be noted that the disclosure is not limited to the disclosed embodiments. Moreover, some embodiments may be combined where appropriate.

Figure 1:
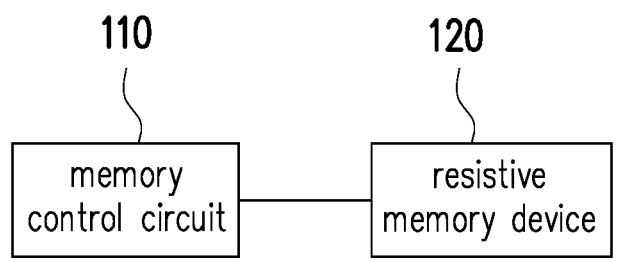
FIG. 1 is a schematic view showing a memory storage device according to an embodiment of the disclosure.
Figure 2:
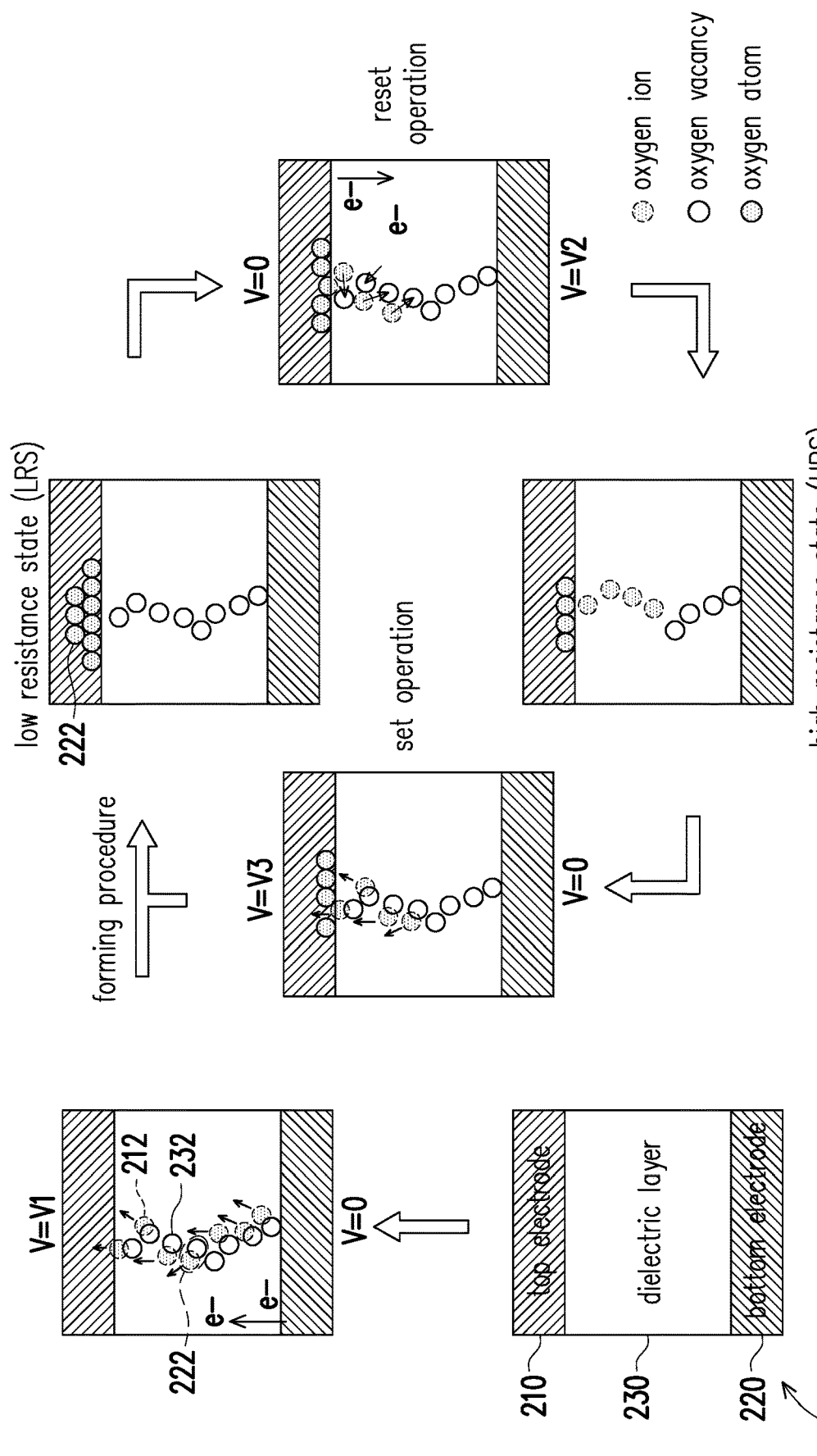
FIG. 2 is a schematic view showing a filament in a memory cell during a forming procedure, a reset operation and a set operation according to an embodiment of the disclosure.

FIG. 1 is a schematic view showing a memory storage device according to an embodiment of the disclosure. FIG. 2 is a schematic view showing a filament in a memory cell during a forming procedure, a reset operation and a set operation according to an embodiment of the disclosure. With reference to FIG. 1 and FIG. 2, in this embodiment, a memory storage device 100 includes a memory control circuit 110 and a resistive memory device 120. The resistive memory device 120 is coupled to the memory control circuit 110. The resistive memory device 120 includes a plurality of memory cells 122 arranged in array. In this embodiment, the memory cell 122 includes a top electrode 210, a bottom electrode 220 and a dielectric layer 230. The top electrode 210 and the bottom electrode 220 are good metal conductors and may be formed of the same or different materials. The dielectric layer 230 is disposed between the top electrode 210 and the bottom electrode 220. The dielectric layer 230 includes a dielectric material such as a transition metal oxide that is, for example but not limited to, $HfO_2$, $Al_2O_3$, or $Ta_2O_5$. The memory cell 122 has at least two resistance states. As different voltages are applied to the top electrode 210 and the bottom electrode 220 respectively to change the resistance state of the memory cell 122, the memory cell 122 may provide a data storage function.

In this embodiment, the memory cell 122 has, for example, a 1-transistor-1-resistor (1T1R) structure or a 2-transistor-2-resistor (2T2R) structure, and implementations thereof may be understood sufficiently from the teaching, suggestion, and illustration of the common knowledge of this field. The disclosure does not impose limitations on the structure of the memory cell 122.

In this embodiment, the memory control circuit 110 is adapted to perform a forming procedure on the memory cell 122. During this process, a bias voltage V1 (i.e. the forming voltage) is continuously applied to the electrodes at both ends of the memory cell 122 so as to generate an applied electric field to the dielectric layer 230. In this embodiment, a positive voltage with a value of V1 volts is applied to the top electrode 210, and a voltage of 0 volts is applied to the bottom electrode 220. This applied electric field separates an oxygen atom 222 into an oxygen ion 212 and an oxygen vacancy 232. The oxygen vacancy 232 forms a filament in the dielectric layer 230 that serves as a current transmission path. When the applied electric field exceeds a threshold value, a dielectric breakdown occurs in the dielectric layer 230 so that the dielectric layer 230 is changed from a high resistance state (HRS) to a low resistance state (LRS). This kind of breakdown is not permanent, and the resistance may still be changed.

The memory cell 122 after the forming procedure has a low resistance state. During the reset operation, a voltage of 0 volts is applied to the top electrode 210 of the memory cell 122, and a positive voltage with a value of V2 volts is applied to the bottom electrode 220. This voltage difference is the reset voltage, e.g. −V2 volts. The memory cell 122 after the reset operation is changed from the low resistance state to a high resistance state. Then, during the set operation, a positive voltage with a value of V3 volts is applied to the top electrode 210 of the memory cell 122, and a voltage of 0 volts is applied to the bottom electrode 220. This voltage difference is the set voltage, e.g. +V3 volts. The memory cell 122 after the set operation is changed from the high resistance state to the low resistance state. In this embodiment, the magnitude and polarity of the reset voltage and the set voltage are used for illustration only and should not be construed as limitations to the disclosure. In this embodiment, the forming procedure, the reset operation and the set operation as shown in FIG. 2 are used for illustration only and should not be construed as limitations to the disclosure.

Figure 3:
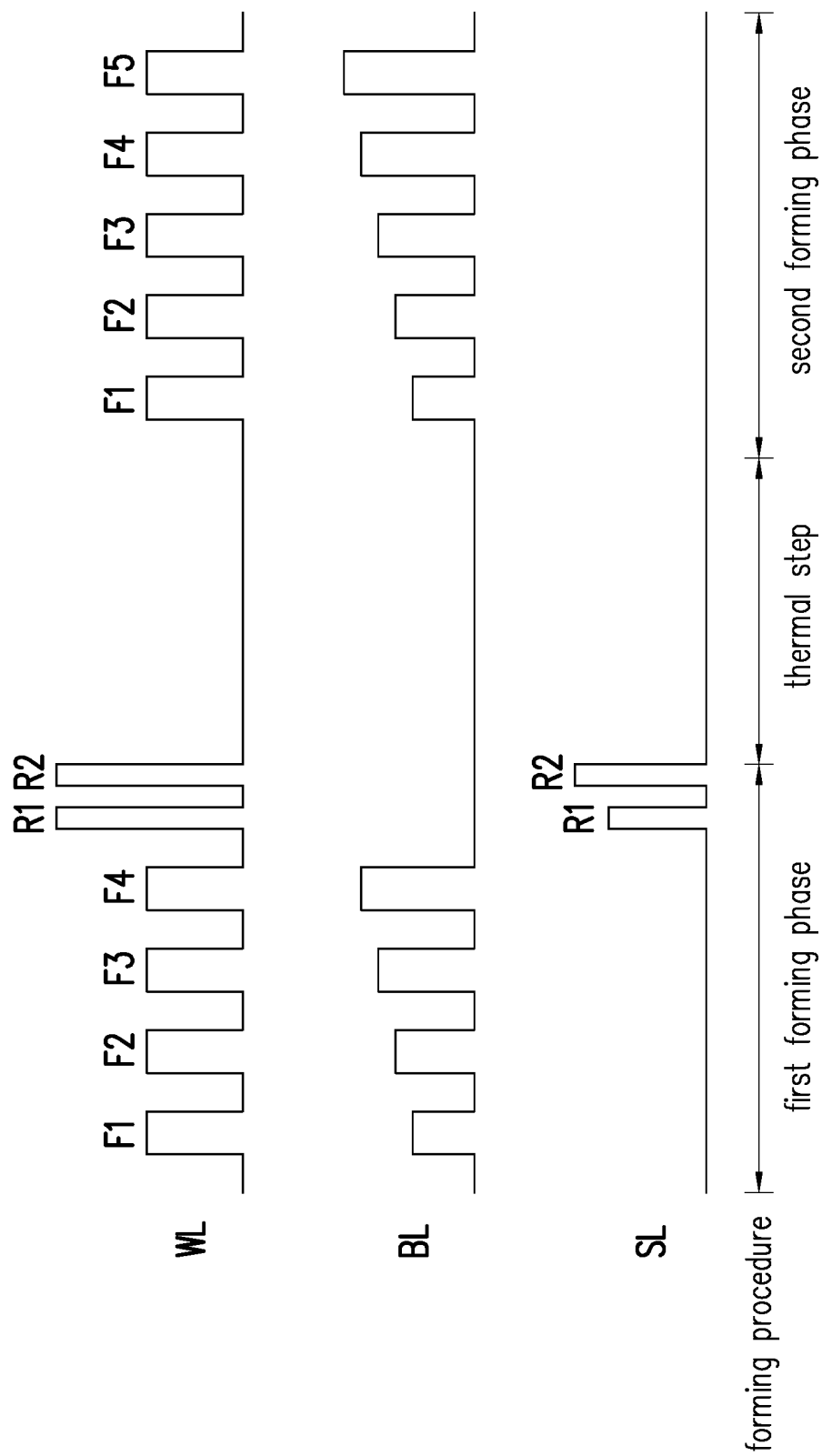
FIG. 3 is a schematic view showing a power on reset method according to an embodiment of the disclosure.

FIG. 3 is a schematic view showing a power on reset method according to an embodiment of the disclosure. With reference to FIG. 3, the power on reset method in this embodiment is at least applicable to the memory storage device 100 of FIG. 1, for example. Herein, the memory control circuit 110 performs the power on reset method on any of the memory cells 122 in the resistive memory device 120. In one embodiment, the power on reset method may also be performed on the memory storage device 100 by a testing machine either directly or through the memory control circuit 110. In this embodiment, the memory cell 122 is connected to a word line WL, a bit line BL and a source line SL that are corresponding to the memory cell 122, and implementations thereof may be understood sufficiently from the teaching, suggestion, and illustration of the common knowledge of this field. In this embodiment, the operation in which the memory storage device 100 applies the forming voltage and the reset voltage to the memory cell 122 includes applying corresponding voltage signals to the word line, the bit line and the source line of the memory cell 122. WL, BL and SL as denoted in FIG. 3 are waveforms of the signals applied to the word line, the bit line and the source line of the memory cell 122 respectively when the memory control circuit 110 performs the operation of applying the forming voltage and the reset voltage to the memory cell 122.

With reference to FIG. 3, in this embodiment, the power on reset method includes performing a forming procedure on the memory cell 122 as shown in FIG. 3. In this embodiment, the forming procedure includes a first forming phase, a thermal step and a second forming phase. The thermal step is performed between the first forming phase and the second forming phase. In one embodiment, the forming procedure may also not include the thermal step. In one embodiment, the forming procedure may also not include the second forming phase. In this embodiment, the thermal step includes, for example, performing a baking process on the memory cell 122 at 280° C. for five minutes. The disclosure does not impose limitations on the time length and temperature of the baking process.

In this embodiment, the forming procedure includes applying at least one forming voltage and at least one reset voltage to the memory cell 122. Specifically, in this embodiment, during the first forming phase, the memory control circuit 110 applies forming voltages F1 to F4 and reset voltages R1 and R2 to the memory cell 122. In this embodiment, after the memory control circuit 110 applies the forming voltage F1 to the memory cell 122, the memory control circuit 110 performs a read verification operation on the memory cell 122 to determine whether a read current of the memory cell 122 is greater than a verification current. The verification current is, for example, 8 microamperes (μA). If the read current of the memory cell 122 is greater than the verification current, the memory control circuit 110 does not apply the next forming voltage F2 to the memory cell 122 but applies the reset voltage R1 instead. In contrast, if the read current of the memory cell 122 is not greater than the verification current, the memory control circuit 110 proceeds to apply the next forming voltage F2 to the memory cell 122. Whether or not to apply the forming voltages F3 to F4 to the memory cell 122 may be deduced by analogy and will not be further described herein. Besides, during the second forming phase, the memory control circuit 110 applies forming voltages F1 to F5 to the memory cell 122. During the second forming phase, whether or not to apply the forming voltages F2 to F5 to the memory cell 122 may be deduced by analogy and will not be further described herein. The disclosure does not impose limitations on the number of times to apply a forming voltage. In one embodiment, during the first or the second forming phase, the number of times for the memory control circuit 110 to apply the forming voltage to the memory cell 122 is subjected to a preset maximum number, for example. When the number of times for the memory control circuit 110 to apply the forming voltage to the memory cell 122 reaches the maximum number, the memory control circuit 110 then ends the first or the second forming phase.

In one embodiment, during the first forming phase, the memory control circuit 110 may also apply the forming voltages F1 to F5 to the memory cell 122 without applying the reset voltages R1 and R2, and during the second forming phase, the memory control circuit 110 may apply the forming voltages F1 to F4 and the reset voltages R1 and R2 to the memory cell 122. In other words, in the exemplary embodiments of the disclosure, the step where the memory control circuit 110 applies at least one reset voltage to the memory cell 122 may be performed during the first forming phase or the second forming phase.

In this embodiment, during the first forming phase, the memory control circuit 110 sequentially applies the first reset voltage R1 and the second reset voltage R2 to the memory cell 122 after sequentially applying the forming voltages F1 to F4 to the memory cell 122, for example. In one embodiment, after the memory control circuit 110 applies the first reset voltage R1 to the memory cell 122, the memory control circuit 110 performs a read verification operation on the memory cell 122 to determine whether a read current of the memory cell 122 is greater than a verification current. The verification current is, for example, 15 microamperes (μA). If the read current of the memory cell 122 is greater than the verification current, the memory control circuit 110 does not apply the second reset voltage R2 to the memory cell 122, and the forming procedure then enters the thermal step. In contrast, if the read current of the memory cell 122 is not greater than the verification current, the memory control circuit 110 proceeds to apply the second reset voltage R2 to the memory cell 122.

In this embodiment, the memory control circuit 110 ends the first forming phase after sequentially applying the first reset voltage R1 and the second reset voltage R2 to the memory cell 122. In one embodiment, the operation in which the memory control circuit 110 sequentially applies the first reset voltage R1 and the second reset voltage R2 to the memory cell 122 may also be performed between any two applications of the forming voltage to the memory cell 122 or before the application of the forming voltage F1 to the memory cell 122. The disclosure is not limited thereto.

In one embodiment, the forming procedure may also not include the second forming phase. For example, after the thermal step, the memory Control circuit 110 performs a read verification operation on the memory cell 122 to determine whether a read current of the memory cell 122 is greater than a verification current. The verification current is, for example, 8 microamperes (μA). If the read current of the memory cell 122 is greater than the verification current, the memory control circuit 110 ends the forming procedure. Consequently, the forming procedure does not include the second forming phase.

In contrast, if the read current of the memory cell 122 is not greater than the verification current, the forming procedure enters the second phase. During the second forming phase, the memory control circuit 110 applies the forming voltages F1 to F5 to the memory cell 122. Similarly, during the second forming phase, after the memory control circuit 110 applies the forming voltage F1 to the memory cell 122, the memory control circuit 110 performs a read verification operation on the memory cell 122 to determine whether a read current of the memory cell 122 is greater than a verification current. The verification current is, for example, 8 microamperes (μA). If the read current of the memory cell 122 is greater than the verification current, the memory control circuit 110 does not apply the next forming voltage F2 to the memory cell 122. In contrast, if the read current of the memory cell 122 is not greater than the verification current, the memory control circuit 110 proceeds to apply the next forming voltage F2 to the memory cell 122. During the second forming phase, whether or not to apply the forming voltages F3 to F5 to the memory cell 122 may be deduced by analogy and will not be further described herein.

In this embodiment, when the first reset voltage R1 is applied to the memory cell 122, the memory control circuit 110, for example, applies voltage signals of 3 volts and 1.8 volts to the word line and the source line of the memory cell 122 respectively, and the pulse width thereof is, for example, 100 nanoseconds (ns). In this embodiment, the pulse width of each of the forming voltages F1 to F5 is, for example, 15 microseconds (μs). The disclosure does not impose limitations on the pulse width of each voltage. When the second reset voltage R2 is applied to the memory cell 122, the memory control circuit 110, for example, applies voltage signals of 3 volts and 2.2 volts to the word line and the source line of the memory cell 122 respectively, and the pulse width thereof is, for example, 100 nanoseconds (ns). Consequently, in this embodiment, the first reset voltage R1 and the second reset voltage R2 that are applied to the word line corresponding to the memory cell 122 have the same pulse height (i.e. the same voltage value) such as 3 volts for both reset voltages, thereby saving power consumption and increasing operation speed. The first reset voltage R1 and the second reset voltage R2 that are applied to the source line corresponding to the memory cell 122 have different pulse heights (i.e. different voltage values) such as 1.8 volts and 2.2 volts respectively. That is, the pulse height of the second reset voltage R2 is greater than the pulse height of the first reset voltage R1 so as to prevent erroneous determination during verification. The disclosure does not impose limitations on the voltage value.

In one embodiment, after the forming procedure is ended, the power on reset method, for example, may further include performing an initial reset operation/procedure on the memory cell 122 or performing a pre-cycle operation/procedure on the memory cell 122. The initial reset operation/procedure and the pre-cycle operation/procedure may be understood sufficiently from the teaching, suggestion, and illustration of the common knowledge of this field.

In this embodiment, the reset voltage is applied to the memory cell 122 during the forming procedure. The voltage value of the reset voltage of the forming procedure is less than the voltage value of a normal reset voltage, and the voltage value of the normal reset voltage is less than the voltage value of an initial reset voltage. The reset voltage of the forming procedure reduces the resistance of the memory cell 122, and the initial reset voltage increases the resistance of the memory cell 122.

In one embodiment, during the operation in which the forming voltage is applied to the memory cell 122, a voltage of 2 to 5 volts is applied to the word line WL of the memory cell 122, a voltage of 3 to 6 volts is applied to the bit line BL of the memory cell 122, a voltage of 0 volts is applied to the source line SL of the memory cell 122 (such as grounded), and the pulse width is 1 to 100 microseconds, for example. In one embodiment, during the operation in which the normal reset voltage is applied to the memory cell 122, a voltage of 2 to 5 volts is applied to the word line WL of the memory cell 122, a voltage of 0 volts is applied to the bit line BL of the memory cell 122, a voltage of 2 to 4 volts is applied to the source line SL of the memory cell 122, and the pulse width is 0.1 to 10 microseconds, for example. In one embodiment, during the operation in which a normal set voltage is applied to the memory cell 122, a voltage of 2 to 5 volts is applied to the word line WL of the memory cell 122, a voltage of 2 to 4 volts is applied to the bit line BL of the memory cell 122, a voltage of 0 volts is applied to the source line SL of the memory cell 122, and the pulse width is 0.1 to 10 microseconds, for example.

In one embodiment, during the operation in which the reset voltage of the forming procedure is applied to the memory cell 122, a voltage of 2 to 5 volts is applied to the word line WL of the memory cell 122, a voltage of 0 volts is applied to the bit line BL of the memory cell 122, a voltage of 1 to 3 volts is applied to the source line SL of the memory cell 122, and the pulse width is 0.1 to 10 microseconds, for example.

Figure 4:
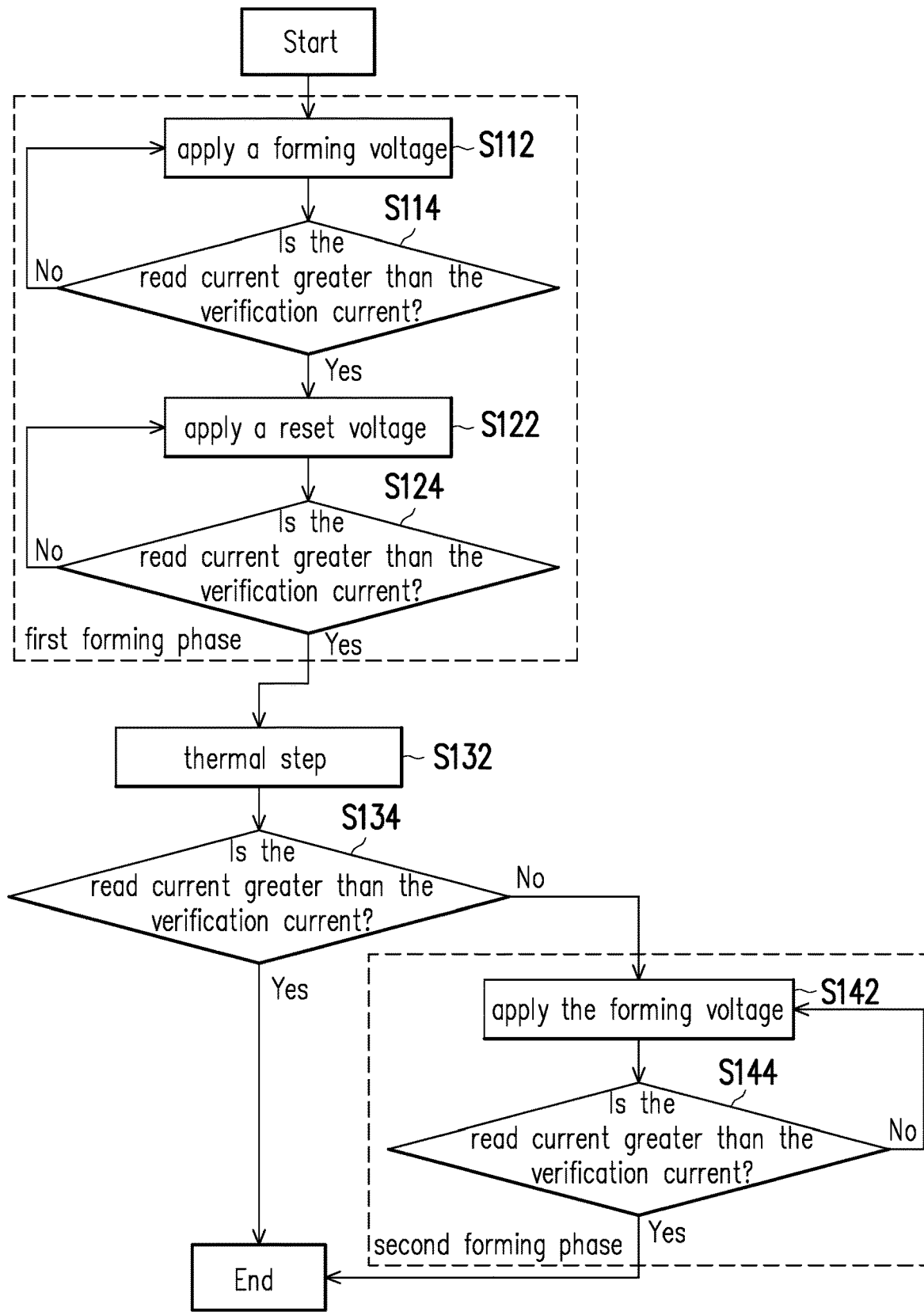
FIG. 4 is a flowchart showing steps of a power on reset method according to an embodiment of the disclosure.

FIG. 4 is a flowchart showing steps of a power on reset method according to an embodiment of the disclosure. With reference to FIG. 4, the power on reset method in this embodiment is at least applicable to the memory storage device 100 of FIG. 1, for example. In step S112, the memory control circuit 110 applies a forming voltage, such as the forming voltage F1, to the memory cell 122. In step S114, the memory control circuit 110 performs a read verification operation on the memory cell 122 to determine whether a read current of the memory cell 122 is greater than a verification current. In step S114, the verification current is set to be 8 microamperes (μA), for example, but the disclosure is not limited thereto. If the read current of the memory cell 122 is not greater than the verification current, the memory control circuit 110 repeats step S112 to apply a forming voltage to the memory cell 122 again, such as the forming voltage F2. If the read current of the memory cell 122 is greater than the verification current, the memory control circuit 110 proceeds to perform the next step. Consequently, the memory control circuit 110 during the first forming phase may only apply one forming voltage to the memory cell 122, i.e. the forming voltage F1. In one embodiment, the number of times for the memory control circuit 110 to perform step S112 is not more than four times, for example. After the memory control circuit 110 performs step S112 for four times, if the read current of the memory cell 122 is still not greater than the verification current, the memory control circuit 110 then performs step S122.

In step S122, the memory control circuit 110 applies a reset voltage, such as the first reset voltage R1, to the memory cell 122. Then, in step S124, the memory control circuit 110 performs a read verification operation on the memory cell 122 to determine whether a read current of the memory cell 122 is greater than a verification current. In step S124, the verification current is set to be 15 microamperes (μA), for example, but the disclosure is not limited thereto. If the read current of the memory cell 122 is not greater than the verification current, the memory control circuit 110 repeats step S122 to apply a reset voltage to the memory cell 122 again, such as the second reset voltage R2. If the read current of the memory cell 122 is greater than the verification current, the memory control circuit 110 proceeds to perform step S132 and heats up the memory cell 122. In this embodiment, after the second reset voltage R2 is applied, if the read current of the memory cell 122 is not greater than the verification current, the memory control circuit 110 blocks the memory cell 122 or repairs the memory cell 122. In this embodiment, blocking the memory cell 122 means that the memory cell 122 failing to pass the verification is not used when the memory control circuit 110 accesses the data stored in the resistive memory device 120. Consequently, the memory control circuit 110 during the first forming phase may only apply one reset voltage to the memory cell 122, i.e. the first reset voltage R1.

Then, in step S134, the memory control circuit 110 performs a read verification operation on the memory cell 122 to determine whether a read current of the memory cell 122 is greater than a verification current. In step S134, the verification current is set to be 8 microamperes (μA), for example, but the disclosure is not limited thereto. If the read current of the memory cell 122 is not greater than the verification current, the memory control circuit 110 proceeds to perform step S142. The forming procedure enters the second forming phase. In step S142, the memory control circuit 110 applies a forming voltage, such as the forming voltage F1, to the memory cell 122. If the read current of the memory cell 122 is greater than the verification current, the memory control circuit 110 ends the forming procedure. Consequently, in this embodiment, the forming procedure may not include the second forming phase.

Then, in step S144, the memory control circuit 110 performs a read verification operation on the memory cell 122 to determine whether a read current of the memory cell 122 is greater than a verification current. In step S144, the verification current is set to be 8 microamperes (μA), for example, but the disclosure is not limited thereto. If the read current of the memory cell 122 is not greater than the verification current, the memory control circuit 110 repeats step S142 to apply a forming voltage to the memory cell 122 again, such as the forming voltage F2. If the read current of the memory cell 122 is greater than the verification current, the memory control circuit 110 ends the forming procedure. Consequently, the memory control circuit 110 during the second forming phase may only apply one forming voltage to the memory cell 122, i.e. the forming voltage F1. In one embodiment, the number of times for the memory control circuit 110 to perform step S142 is not more than five times, for example. After the memory control circuit 110 performs step S142 for five times, if the read current of the memory cell 122 is still not greater than the verification current, the memory control circuit 110 then ends the forming procedure.

Besides, the power on reset method in this embodiment may be understood sufficiently from the teaching, suggestion, and illustration of the embodiments of FIG. 1 to FIG. 3. Thus, details thereof are not repeated hereinafter.

In summary, in the exemplary embodiments of the disclosure, the power on reset method includes applying the reset voltage to the memory cell during the forming procedure. In the exemplary embodiments of the disclosure, the forming procedure includes applying at least one forming voltage and at least one reset voltage to the memory cell. The forming procedure further includes the thermal step. The step of applying at least one reset voltage to the memory cell may be performed before or after the thermal step. In the exemplary embodiments of the disclosure, after one forming voltage is applied, if the memory cell passes verification, the next forming voltage is not applied to the memory cell. After the thermal step, if the memory cell passes verification, the next forming voltage is not applied to the memory cell. That is to say, the forming procedure does not include the second forming phase. In addition, after one reset voltage is applied, if the memory cell passes verification, the next reset voltage is not applied to the memory cell.

In the exemplary embodiments of the disclosure, the step of applying the reset voltage to the memory cell may be performed during the first forming phase or the second forming phase of the forming procedure. The memory control circuit, after applying the reset voltage to the memory cell, performs a verification operation on the memory cell. If the memory cell fails to pass the verification, the memory control circuit may block or repair the memory cell. The quality of the memory cell may thus be detected during the forming procedure in the power on reset phase, thereby improving product reliability of the resistive memory storage device and reducing testing costs.

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power on reset method for a resistive memory storage device, the power on reset method comprising:
   performing a forming procedure on a memory cell of the resistive memory storage device, wherein the forming procedure comprises a first forming phase and a thermal step which the first forming phase is performed immediately followed by the thermal step, wherein the first forming phase comprises applying at least one forming voltage to the memory cell and applying at least one reset voltage to the memory cell without applying any set voltage to the memory cell after applying at least one reset voltage to the memory cell and before the thermal step.

2. The power on reset method for the resistive memory storage device as recited in claim 1, wherein during the first forming phase, a read verification operation is performed on the memory cell every time after a forming voltage is applied so as to determine whether a read current of the memory cell is greater than a verification current, wherein a next forming voltage is not applied to the memory cell if the read current of the memory cell is greater than the verification current, and the next forming voltage is applied to the memory cell if the read current of the memory cell is not greater than the verification current.

3. The power on reset method for the resistive memory storage device as recited in claim 1, the power on reset method further comprising:
   after the thermal step, performing a read verification operation on the memory cell to determine whether a read current of the memory cell is greater than a verification current,
   wherein the forming procedure is ended if the read current of the memory cell is greater than the verification current, and the forming procedure enters a second forming phase if the read current of the memory cell is not greater than the verification current.

4. The power on reset method for the resistive memory storage device as recited in claim 3, wherein the forming procedure further comprises the second forming phase, wherein applying the at least one reset voltage to the memory cell is performed during one of the first forming phase and the second forming phase, and the thermal step is performed between the first forming phase and the second forming phase.

5. The power on reset method for the resistive memory storage device as recited in claim 4, wherein applying the at least one reset voltage to the memory cell is performed during the second forming phase, and the second forming phase is ended after the at least one reset voltage is applied to the memory cell.

6. The power on reset method for the resistive memory storage device as recited in claim 4, wherein during the second forming phase, the at least one Ruining voltage is applied to the memory cell, and the read verification operation is performed on the memory cell every time after a forming voltage is applied so as to determine whether the read current of the memory cell is greater than the verification current, wherein a next forming voltage is not applied to the memory cell if the read current of the memory cell is greater than the verification current, and the next forming voltage is applied to the memory cell if the read current of the memory cell is not greater than the verification current.

7. The power on reset method for the resistive memory storage device as recited in claim 1, wherein applying the at least one reset voltage to the memory cell comprises:
   applying a first reset voltage to the memory cell;
   performing a read verification operation on the memory cell to determine whether a read current of the memory cell is greater than a verification current;
   performing a thermal step if the read current of the memory cell is greater than the verification current; and
   applying a second reset voltage to the memory cell if the read current of the memory cell is not greater than the verification current.

8. The power on reset method for the resistive memory storage device as recited in claim 7, wherein the first reset voltage and the second reset voltage that are applied to a word line corresponding to the memory cell have a same pulse height.

9. The power on reset method for the resistive memory storage device as recited in claim 7, wherein the first reset voltage and the second reset voltage that are applied to a source line corresponding to the memory cell have different pulse heights.

* * * * *